(12) United States Patent
Choi et al.

(10) Patent No.: US 6,661,707 B2
(45) Date of Patent: Dec. 9, 2003

(54) METHOD OF PROGRAMMING NAND-TYPE FLASH MEMORY

(75) Inventors: Jeong-Hyuk Choi, Kyunggi-do (KR); Yun-Sung Shin, Seoul (KR)

(73) Assignee: SamSung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/074,306

(22) Filed: Feb. 11, 2002

(65) Prior Publication Data

US 2002/0114187 A1 Aug. 22, 2002

(30) Foreign Application Priority Data

Feb. 16, 2001 (KR) .......................................... 2001-7914

(51) Int. Cl.$^7$ ................................................. G11C 7/00
(52) U.S. Cl. ............................ 365/185.17; 365/185.18; 365/185.29
(58) Field of Search ........................ 365/185.22, 185.17, 365/185.29, 185.24, 185.11, 185.19, 185.33, 185.18

(56) References Cited

U.S. PATENT DOCUMENTS

| | | | |
|---|---|---|---|
| 5,671,176 A | * | 9/1997 | Jang et al. ............. 365/185.02 |
| 5,717,635 A | * | 2/1998 | Akatsu ................... 365/185.05 |
| 5,751,631 A | * | 5/1998 | Liu et al. ................ 365/185.01 |
| 6,091,636 A | * | 7/2000 | Liu et al. ................ 365/185.19 |
| 6,487,117 B1 | * | 11/2002 | Choi et al. ............. 365/185.17 |

OTHER PUBLICATIONS

Kang, et al. NAND Flash Memory With Incremental Step Pulse Programming Scheme 1995 pp. 128–129 of ISSCC.

* cited by examiner

Primary Examiner—David Nelms
Assistant Examiner—Gene N. Auduong
(74) Attorney, Agent, or Firm—Marger Johnson & McCollum, P.C.

(57) ABSTRACT

A method of programming a NAND-type flash memory device having bitlines and wordlines, and memory strings composed of memory cells serially connected between string select transistors coupled to each of the bitlines and ground select transistors coupled to a source line. The method comprises of applying a first voltage to one or more unselected wordlines, then applying a predetermined bitline voltage to an unselected bitline, and then applying a second voltage to the unselected wordlines, and concurrently applying a third voltage to a selected one out of the wordlines. Thus, a program disturbance phenomenon can be prevented.

13 Claims, 13 Drawing Sheets

Fig. 3A

|  | Erase | Program | Read |
|---|---|---|---|
| SL1(select) | floating | 0V | 1V |
| SL2(unselect) | floating | Vcc | 0V |
| SSL | Vers | Vcc | Vcc |
| WLn(unselect) | 0V | Vpass | Vcc |
| WL2(select) | 0V | Vpgm | 0V |
| GSL | Vers | 0V | VCC |
| CSL | floating | 0V | 0V |
| bulk(or substrate) | Vers | 0V | 0V |

METHOD OF PROGRAMMING NAND-TYPE FLASH MEMORY

This application relies for priority upon Korean Patent Application No. 2001-07914, filed on Feb. 16, 2001, the contents of which are herein incorporated by reference in their entirety.

1. Field of the Invention

The present invention relates to a flash memory device and, more particularly, to a method of programming a flash memory device with a NAND-type cell array.

2. Background of the Invention

Flash memory devices are block or sector-erasable memory devices, and data readable/writable non-volatile memory devices. As one of the flash memory devices, a flash memory device with a NAND-type flash memory cell array (hereinafter referred to as "NAND flash") benefits from high integration, in which memory cell strings composed of memory cells are serially connected to a bitline. A NAND flash having such a configuration is disclosed in the paper ISSCC 1995, pp. 128–129, published in 1995.

FIG. 1 is a diagram of a memory cell array as taught in the ISSCC 1995 paper. A plurality of memory cell strings are each connected to a plurality of bitlines. FIG. 1 is transversed by wordlines WL1–WL16.

A unit cell string is associated with a single bitline intersecting a number of wordlines. For example, a unit cell string is composed of a string select transistor SST connected to bitline BL1, a ground select transistor GST connected to a common source line CSL, and a plurality of memory cells (or cell transistors) M11–M161 serially coupled between the select transistors SST and GST. Gates of the memory cells M11–M161 are each coupled to wordlines WL1–WL16.

Each memory cell is composed of a floating gate isolated from a channel region by a tunnel oxide layer (having a thickness of about 100 Å) interposed therebetween, and a flash EEPROM (electrically erasable and programmable read only memory) having a control gate stacked over the floating gate with an interlayer insulating layer interposed therebetween.

Memory cells are now compared, to illustrate a difference in their treatment.

FIG. 2A is an equivalent circuit diagram of a selected memory cell in programming. Referring now to FIG. 2A, if a voltage Vcg is applied to a wordline coupled to a control gate, a voltage Vfg applied to a floating gate is determined by a coupling ratio of a capacitance Ci between the floating gate and the control gate to a capacitance Ct between the floating gate and the channel region.

$$Vfg=[Ct/(Ct+Ci)] \times Vcg \quad\quad \text{[FIG. 2A, selected cell]}$$

FIG. 2B is an equivalent circuit diagram of an unselected memory cell in programming. Referring now to FIG. 2B, if a voltage Vcg is applied to an unselected cell, a voltage Vfg applied to a floating gate is determined by:

$$Vfg=[(Ci+Cch)/(2Ci+Cch)] \times Vcg \quad\quad \text{[FIG. 2B, unselected cell]}$$

It will be noted that Vfg is different for selected and unselected cells.

FIG. 3A is a table showing applied voltages used for program, erase, and read operations in the NAND flash of FIG. 1. FIG. 3B shows the sequence of applying voltages in the prior art.

Referring to FIGS. 1, 3A, 3B, it is assumed that M21 is a selected memory cell. Then 0V is applied to a selected bitline (e.g., BL1) and the ground select line GSL. A power supply voltage Vcc of about 3V is applied to a unselected bitline BL2 and to a string select line SSL. A program voltage Vpgm of about 20V is applied to the selected wordline (in this case, WL2). And, a pass voltage Vpass of about 12V is applied to the unselected wordlines WL1, WL3–WL16.

The applied 0V is applied to a channel of the selected memory cell M21 through the string select transistor SST1 and the memory cell M1. A voltage difference between the floating gate and the channel results in F-N (Fowler-Nordheim) tunneling. Electrons are then moved from the channel region to the floating gate, enabling a threshold voltage to increase in 1V.

An erase operation is carried out with a wordline unit (or page unit; memory cells coupled to one wordline composes one page). Generally, memory cells coupled to all wordlines in a unit cell string are defined with a block unit (or sector unit), which is used as an elementary unit of the erase.

If 0V is applied to a selected wordline and an erase voltage Vers of about 24V is applied to a bulk area (separated with a block or sector unit), an inverse electric field to a program operation is formed, which moves electrons from the floating gate to the bulk area. As a result, the threshold voltage of the memory cell is changed to −3V.

The read operation utilizes the fact that a threshold voltage is changed according to a state of a selected memory cell (i.e., whether the selected memory cell is programmed or erased). When 0V is applied to a selected bitline, unselected wordlines, a string select line SSL, and a ground select line GSL, and 0V is applied to a selected wordline WL2, if a programmed cell is a programmed cell (off-cell), there is no current flowing through the memory cell. And, if the programmed cell is an erased cell (on-cell), a current flowing through the memory cell is generated. A voltage of a bitline reacting to whether a current flows or not according to the memory cell state is sensed to carry out a read operation.

An undesirable programming disturbance phenomenon occurs in a string program inhibit cell or a page program inhibit cell while programming a program cell. In this case, the "program cell" means a memory cell coupled to a selected bitline and a selected wordline; the "string program inhibit cell" means an unselected memory cell belonging to the same string cell as a memory cell (or selected memory cell) coupled to a selected bitline and an unselected wordline; and the "page inhibit cell" means an unselected memory cell coupled to an unselected bitline and a selected wordline or an unselected memory cell belonging to the same page as a selected memory cell.

The programming disturbance phenomenon is that, although such unselected memory cells should not be programmed while programming a selected wordline, they do not retain initial states; in other words, they also become programmed. This is because such unselected memory cells are connected to the selected wordline or a selected bitline from a standpoint of the otherwise desirable circuit configuration of FIG. 1.

A characteristic of the programming disturbance phenomenon varies in accordance with intrinsic program or erase states of the program inhibit cells.

To prevent the phenomenon, after obtaining a set width of the pass voltage Vpass based upon the states of the program inhibit cells, a pass voltage is set and applied to a program operation in consideration of a worst case.

Setting the pass voltage changes a channel voltage, causing F-N tunneling contributing to the programming disturbance, because there is a voltage difference of 3V between threshold voltages of a programmed memory cell and an erased memory cell. That is, a channel voltage of the program inhibit cell is set to prevent F-N tunneling.

For example, a voltage of a floating gate is boosted by a program voltage Vpgm in a program inhibit cell M22 coupled to a selected wordline WL2 and an unselected bitline BL2. On the other hand, a channel region of a memory cell is isolated from an external voltage to be floated by 0V applied to GSL and Vcc applied to SSL. If Vpass and Vpgm are applied then, an overall capacitance (Cg) in a gate formed by the foregoing Ci and Ct (control gate+floating gate) can extract an equation "1/Cgate=1/Ci+ 1/Ct". If the channel capacitance (Cch') meets the following equation "Cch'=Cch+Cjnc (junction capacitance at a source and a drain)", a voltage (Vch) induced to a channel of a page program inhibit cell M22 is represented hereinbelow.

$$Vch=Vpass \times (Cg+Cch') \times (WL\ number-1)+(Cg/(Cg+Cch')) \times 1$$

In the same page program inhibit cell as M22, Vch is formed to lower a strength of an electric field between a floating gate and a channel region. Accordingly, M22 can suppress an unwanted program formed by a program voltage Vpgm applied to a control gate. In case of a program inhibit cell such as M22 coupled between a selected wordline WL2 and an unselected bitline BL2, the higher Vpass is, the greater an effect to suppress a programming disturbance (unwanted program) is.

On the other hand, in case of a string program inhibit cell M11 coupled to an unselected wordline WL1 and a selected bitline BL1, electrons are implanted into the floating gate by Vpass applied to WL1 and 0V applied to a bulk area. This results in the formation of an unwanted program (especially, referred to as "pass voltage disturbance"). Therefore, Vpass is applied with a lower level than Vpgm.

Referring to FIG. 3C, a graph illustrates a relationship between a position of a program inhibit cell and a pass voltage. It should be remembered that the cell position is associated with a threshold voltage of the cell.

As will be seen below, the problem in the prior art is that the program disturb curves of unselected memory cells are not identical to each other. Indeed, for less than 7V, the graphs diverge. That is because where a conventional memory device is being programmed, a precharged channel voltage of an unselected memory cell having an erased state is different from that of having a programmed state.

More particularly, if Vpass is low (about 7V and lower), a programming prevention effect is good to a string program inhibit cell, while an unselected memory cell corresponding to the page program inhibit cell is adversely programmed by the program disturbance to boost its threshold voltage. On the other hand, if Vpass is high (about 14V and higher), a programming prevention effect is good to a gate program inhibit cell, while an unselected memory cell corresponding to a string program inhibit cell is adversely programmed by the program disturbance to boost its threshold voltage. Therefore, it is important to suitably set a range of the pass voltage Vpass in consideration of the foregoing relationship. The pass voltage range is called "pass voltage window". The wider the pass voltage window is, the greater an operation margin of the pass voltage.

In case of the program disturbance, a channel boosting voltage of a memory cell M12, coupled between WL2 to which Vpgm is applied and WL1 situated between bitlines, is variable to a state of the memory cell M12, as shown in FIG. 3C. This means that when Vpgm is applied to a gate of M22 and Vpass is applied to a gate of M12, a voltage formed at a channel of M22 is affected by a state of M12 because M12 and M22 are adjacent to each other.

That is, since a threshold voltage of M22 increases by 1V when M12 is put at a programmed state, a channel is not turned on and a channel voltage is not boosted until a voltage of WL2 is at least 1V and higher. When M12 is put at an erased state, a threshold voltage of M22 is −3V and the channel is turned on, although a voltage of WL2 is 0V. As the voltage of WL2 is boosted to be Vpgm after Vcc applied to BL2 is partially applied to the channel of M22 (in this case, a channel voltage boosting amount is denoted as "aV"), a high-level channel voltage can be obtained. Based upon whether M12 was in a program state or in an erase state, the boosted voltage of M12 is represented hereinbelow.

$$Vchp=[(Vpass-1V) \times b \times (WL\ number-1)+(Vpgm-1V) \times b]/WL\ number$$
(M12 was in a program state)

$$Vche=a+[(Vpass \times b \times (WL\ number-1)+Vpgm \times b]/WL\ number$$ (M12 was in an erase state)

$$*b=Cg/(Cg+Cch)$$

When M12 is placed in the erase state, a channel voltage Vche of M22 is higher than Vchp (a channel voltage of M33 when M12 is placed in a program state, i.e., Vche>Vchp. If M12 is programmed, the programming disturbance becomes worse. If an unselected memory cell located between a page program inhibit cell and its bitline is programmed, it is hard to obtain a channel voltage enough to prevent unwanted F-N tunneling. In other words, this means that the programming disturbance more easily occurs than in the erase state. Accordingly, a pass voltage Vpass used in the program operation is determined to a suitable one between values in the program state and in the erase state.

However, if a program progresses using the determined pass voltage Vpass, a channel voltage of the erased unselected memory cell is excessively higher than that of the programmed unselected memory cell. A great amount of current is then generated by function breakdown. And hot carriers, additionally formed, increase a trap density at a source and drain junction and a tunnel oxide layer. This results in early deterioration of the memory cell. Furthermore, the program operation is repeated to create a junction breakdown stress, which breaks down the junction to cause errors of the memory cell. Thus, a junction breakdown voltage of the memory cell must be higher than the boosted channel voltage.

Punch-through and isolation characteristics of the memory cell must be maintained, even when integration is high. To accomplish this in the prior art, impurities of an opposite conductive type to source and drain regions are heavily implanted into an isolation area between bulk and channel areas and the memory cell. Unfortunately, such a process cannot be realized substantially.

SUMMARY OF THE INVENTION

The present invention overcomes the limitations of the prior art. The invention provides methods of realizing a reliable program inhibit function in a NAND flash memory device.

A programming method according to the invention comprises applying a first voltage to one or more of the unselected wordlines. Then a predetermined bitline voltage is applied to an unselected one of the bitlines. And in a third step, a second voltage is applied to the unselected wordlines, and a third voltage is applied to a selected wordline out of the wordlines.

The invention further succeeds in forming a constant channel voltage, which depends on states of a memory cell in a program operation of a NAND flash.

The invention further succeeds in preventing excessive boosting of a channel voltage of an unselected memory cell which is put in an erase state, even though a program operation is repeated in an NAND flash.

BRIEF DESCRIPTION OF THE DRAWINGS

FIG. 3A is a table of values of voltages to be applied to the device of FIG. 1.

DETAILED DESCRIPTION OF THE PREFERRED EMBODIMENTS

The present invention will now be described more filly hereinafter with reference to accompanying drawings. The invention teaches methods of programming cells of NAND-type flash memory devices. Such devices include bitlines, wordlines, and memory strings. The strings are made of memory cells serially connected between a string select transistor coupled to each of the bitlines, and a ground selection transistor coupled to a source line that is common to a number of strings. The wordlines are each connected to gates of the memory cells.

Figure 1:
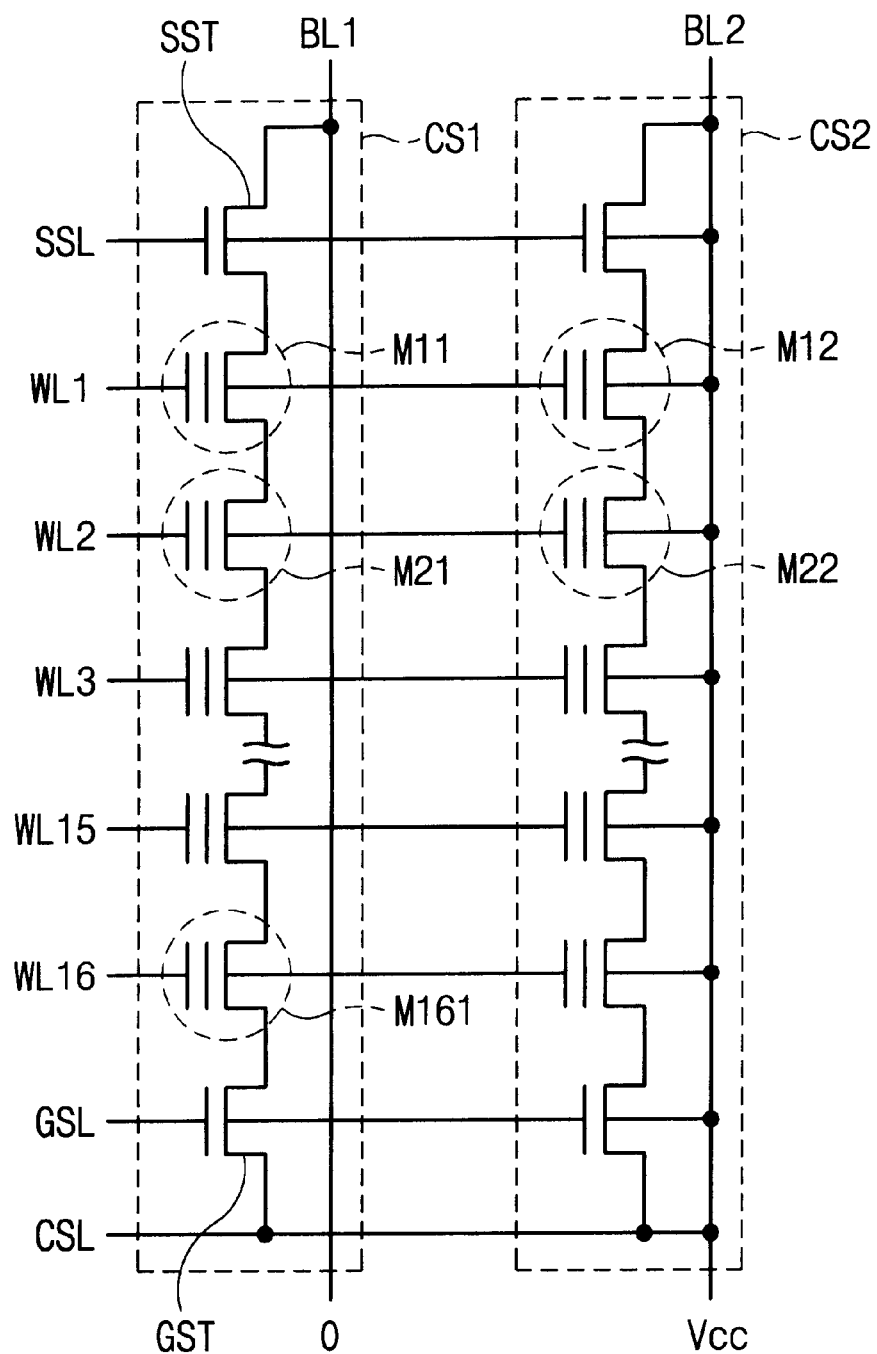
FIG. 1 is a circuit diagram showing a memory cell array of a NAND flash memory device, where methods of the invention may be practiced.
Figure 2A:
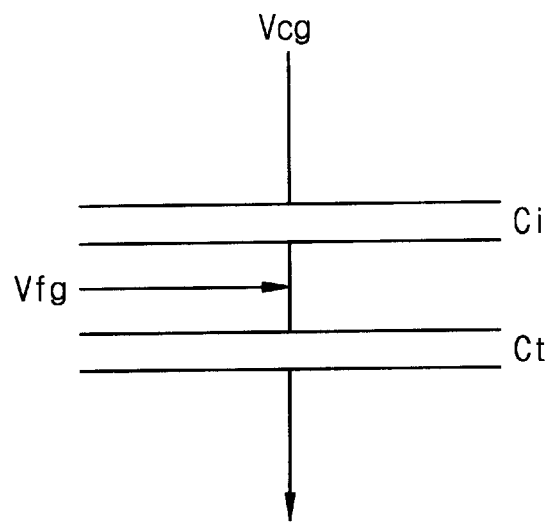
FIG. 2A is an equivalent circuit diagram of a selected memory cell in programming.
Figure 2B:
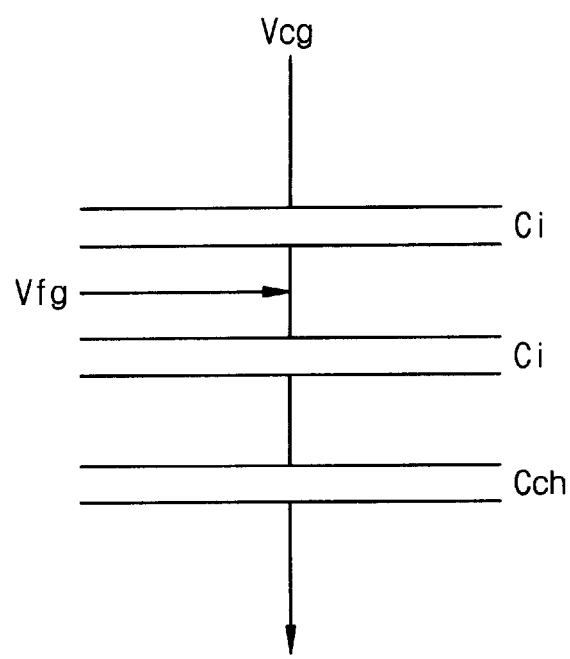
FIG. 2B is an equivalent circuit diagram of an unselected memory cell in programming.
Figure 4:
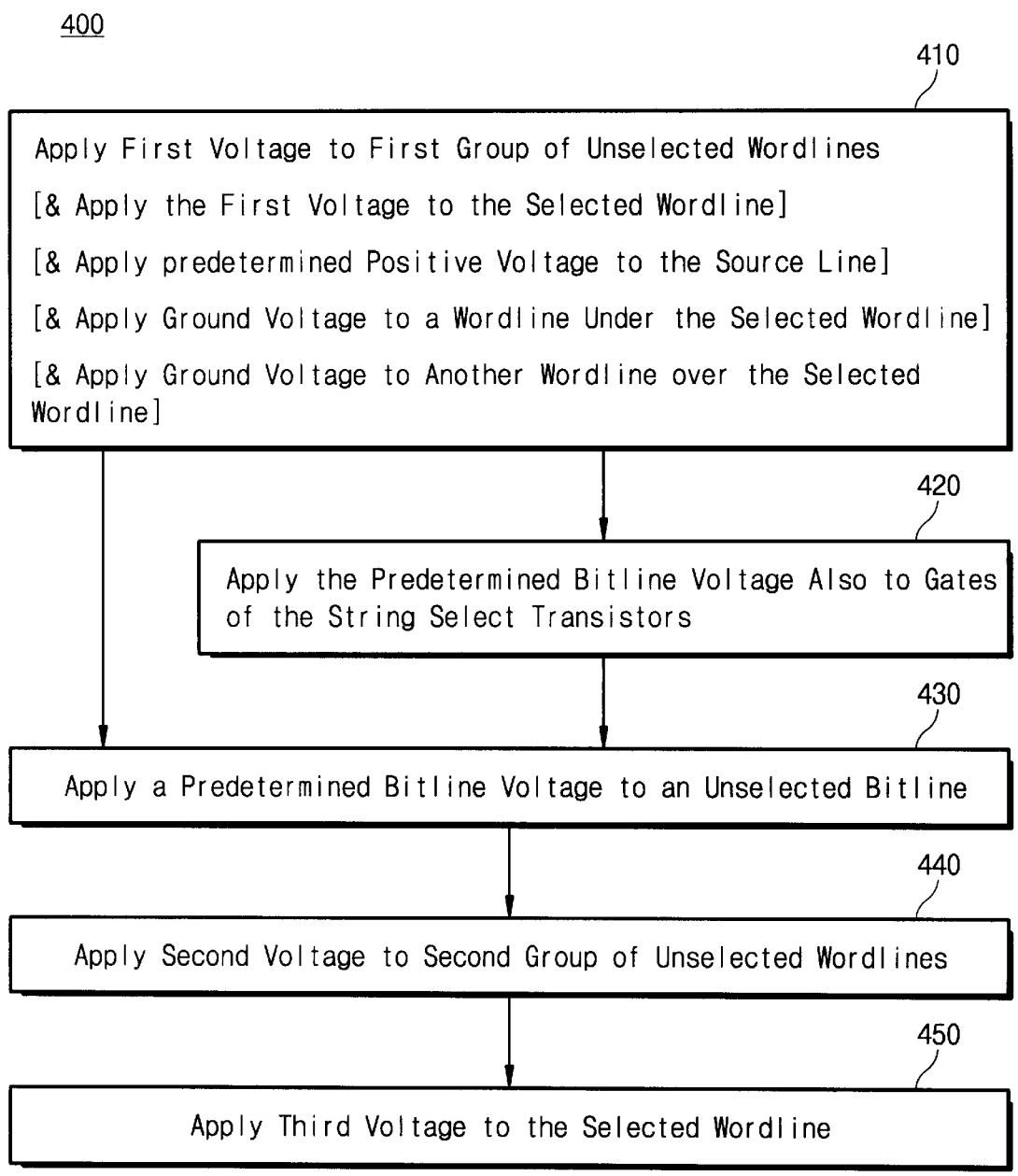
FIG. 4 is a flowchart illustrating a method according to an embodiment of the present invention.

Referring now to FIG. 4, a flowchart 400 is used to illustrate a method according to an embodiment of the invention. The method of flowchart 400 may also be practiced by the device of FIG. 1. For convenience of explanation, assume that memory cell M21 of FIG. 1 is selected. Therefore, the selected wordline is WL2 and the selected bitline BL1.

According to a box 410, a first voltage is applied to a first group of unselected wordlines. This first group is one or more of the wordlines other than WL2. This activates a channel.

Optionally and preferably, at this or a later time the first voltage is also applied to the selected wordline.

Optionally and preferably, at this or a later time a predetermined positive voltage is applied to the source line. The predetermined positive voltage is preferably a power supply voltage level.

In addition, a ground voltage may optionally be applied to gates of the ground select transistors, which are connected. These would include ground select transistors of the string with the selected cell, and of strings with unselected cells.

Optionally and preferably, at this or a later time a ground voltage is applied to a wordline that is under the selected wordline. By under, it is meant between the selected wordline and the common source line. Moreover, a ground voltage is optionally further applied to another wordline over the selected wordline. By over, it is meant between the selected wordline and the corresponding string select transistor. Preferably these unselected wordlines are the ones neighboring the selected wordline from above and below.

According to an optional box 420, a predetermined bitline voltage is applied to gates of the string select transistors, which are coupled together. These would include string select transistors of the string with the selected cell, and of strings with unselected cells. The operation of box 420 may commence at the same time as that of box 410, or as that of box 430 below, or any time in between.

According to a next box 430, the predetermined bitline voltage is then applied to an unselected bitline. This means to a bitline other than BL1. Bitline BL2 is thus a good candidate.

According to a next box 440, a second voltage is then applied to a second group of unselected wordlines. The second group may be the same as the first group.

According to a next box 450, a third voltage is applied to the selected wordline. The operation of box 450 may take place concurrently with that of box 440.

The first voltage is preferably higher than the predetermined bitline voltage and is lower than the second voltage. Preferably the predetermined bitline voltage is a power supply voltage of the NAND-type flash memory device.

Preferably, the predetermined bitline voltage is between 2V and 5V, the first voltage is between 3V and 6V, the second voltage is between 8V and 12V, and the third voltage is between 15V and 20V.

Figure 5:
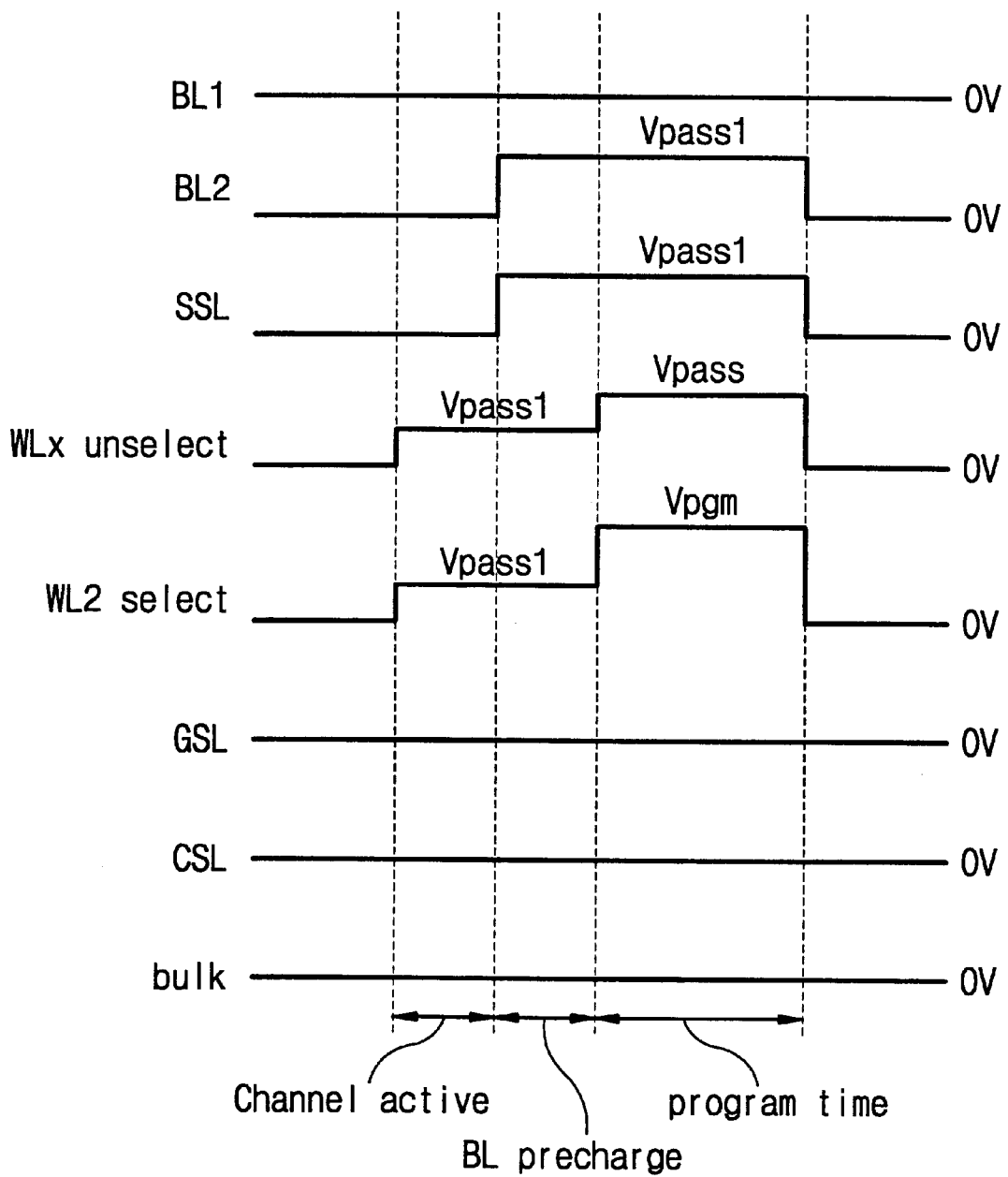
FIG. 5 is a timing view of a program operation according to a first embodiment of the present invention.

Referring to FIG. 5 for explaining a first embodiment of the present invention, 0V is applied to a ground select line GSL, and a voltage Vpass1 is applied to all wordlines, which activates channels of memory cells (channel activation region; "Channel Active"). In this case, Vpass1 is identical or higher to or than a power supply voltage, and is lower than pass voltage Vpass.

Importantly, since voltage Vpass1 is applied to unselected wordlines before a voltage is applied to a selected bitline BL1, channels of unselected memory cells are placed in on-state, even though they are programmed or erased.

Then 0V is applied to selected bitline BL1, and Vcc is applied to string select line SSL and to unselected bitline BL2, during a bitline precharge interval. Thus channel voltages are precharged, similar to bitline voltages (0V and Vcc).

Then a voltage of a selected wordline WL2 is boosted to a program voltage Vpgm, and a voltage of unselected wordlines WLx is boosted from Vpass1 to Vpass, during a program interval. This causes the channel voltages to react to corresponding wordline voltages in the same level to be constant channel boost voltages.

For example, if a threshold voltage of an unselected memory cell placed in an erase state is −3V and Vpass1 is 4V, a voltage of an unselected bitline BL2 is lowered by a threshold voltage of a string select transistor SST1 or SST2. This enables a channel voltage in the channel activation interval "Channel Active" to be precharged to about 2.5V. When Vpass (about 12V) and Vpgm (about 20V) are applied to unselected and selected wordlines, a channel voltage is boosted by a value of "Vpass–Vpass1" and a value of "Vpgm–Vpass1".

If an unselected memory cell is programmed, its threshold voltage is about 1V. However, a channel voltage turned on by Vpass1 (about 12V) is precharged to about 2.5V, and then responds to Vpass and Vpgm to be boosted to the same level as the above-mentioned erased unselected memory cell.

Figure 6:
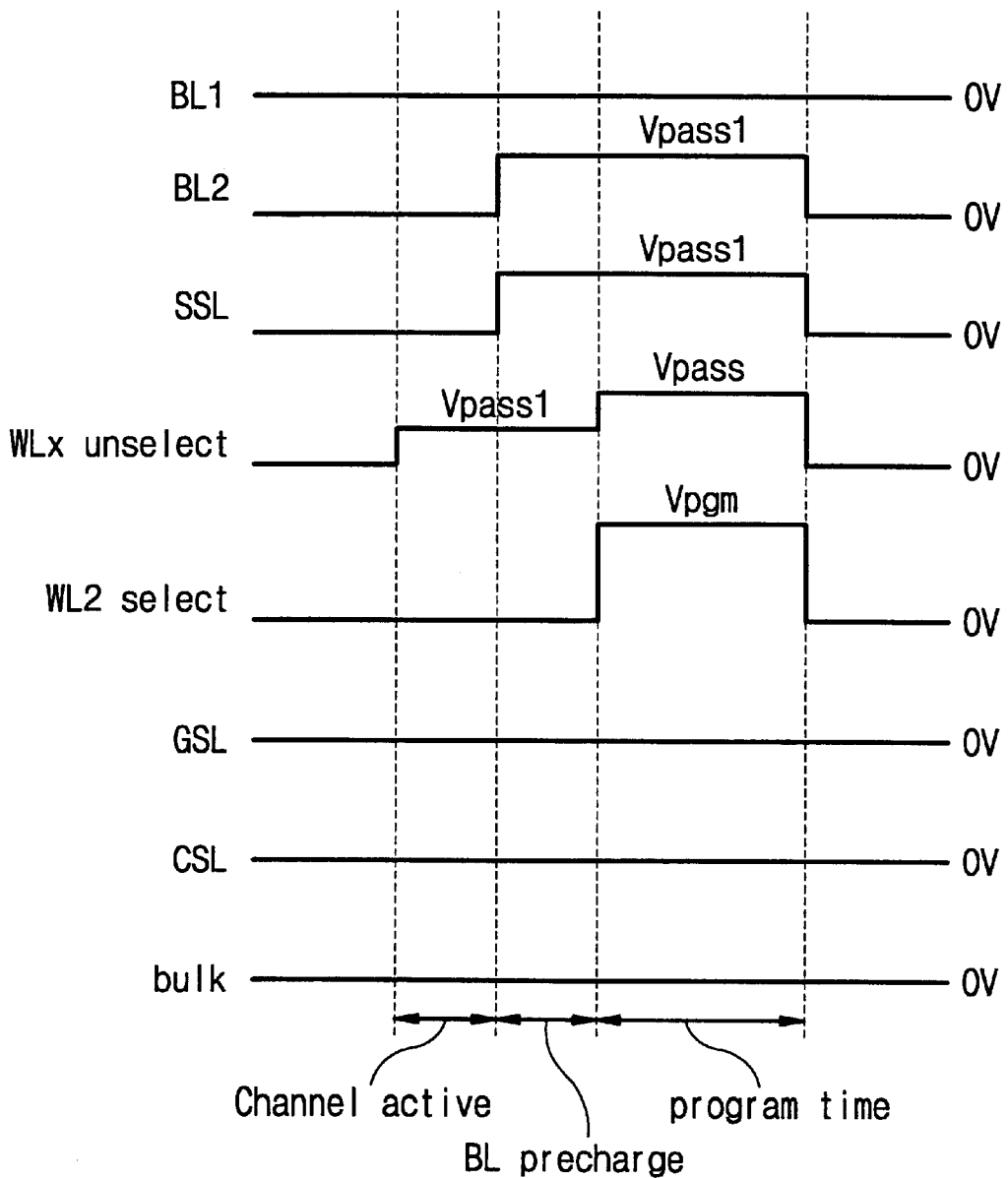
FIG. 6 is a timing view of a program operation according to a second embodiment of the present invention.

Referring to FIG. 6 for explaining a second embodiment of the present invention, voltage conditions of unselected bitlines and wordlines are identical to those in FIG. 5, except for the selected wordline WL2. A voltage of selected wordline WL2 is not boosted to Vpass1 from a channel activation interval, until only for the program interval.

In the above-mentioned string program inhibit cells (memory cells coupled to a selected wordline and an unselected bitline), a channel voltage is boosted by a program voltage of relatively higher level (about 20V). Thus, it is noted that there is no difference between this case and the above case of the first embodiment.

Figure 7:
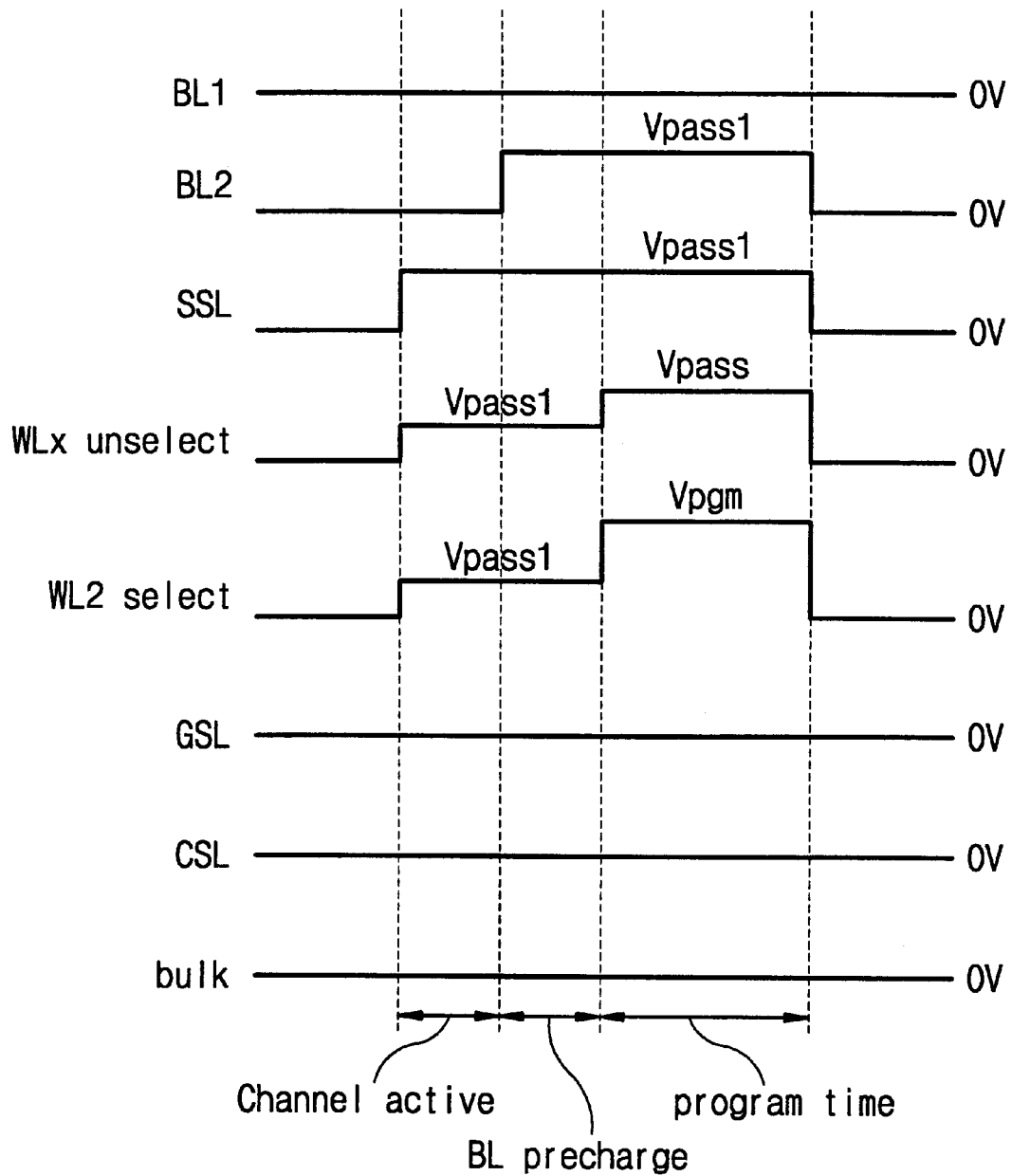
FIG. 7 is a timing view of a program operation according to a third embodiment of the present invention.

Referring to FIG. 7 for explaining a third embodiment of the present invention, the third embodiment is identical to the first embodiment, except the fact that pass voltage Vpass1 is applied to a string select line SSL when or before Vpass1 is applied to an unselected bitline BL2.

This manner is advantageous to constantly retain an initial channel voltage of memory cells (particularly, unselected memory cells) when a channel voltage Vchw1 is higher than a channel voltage Vchb1. Channel voltage Vchb1 equals pass voltage Vpass1 minus Vst, the latter of which is a threshold voltage of a string select transistor. In this case, Vchw1 represents a channel voltage that is induced when Vpass1 is applied to an unselected bitline WLx, and Vchb1 represents a channel voltage that is induced when Vpass1 is applied to an unselected bitline BL2.

This may be better understood by briefly referring also to FIG. 5. In a procedure of forming a channel voltage of FIG. 5, channel voltage Vchw1 is formed by an initial wordline voltage Vpass1. And then, Vchw1 is precharged to level of Vchb1 by pass voltage Vpass1 applied to an unselected bitline. If Vchw1 is higher than Vchb1 with respect to an unselected memory cell placed in an erase state, it is hard to constantly retain initial channel voltages before a program interval. Therefore, if a string select transistor is turned on by a string select line as Vpass1 at least before Vpass1 is applied to an unselected bitline, a channel voltage of an erased memory cell is excessively boosted by a current wordline voltage Vpass1, which prevents the channel voltage from increasing over Vchb1.

Figure 8:
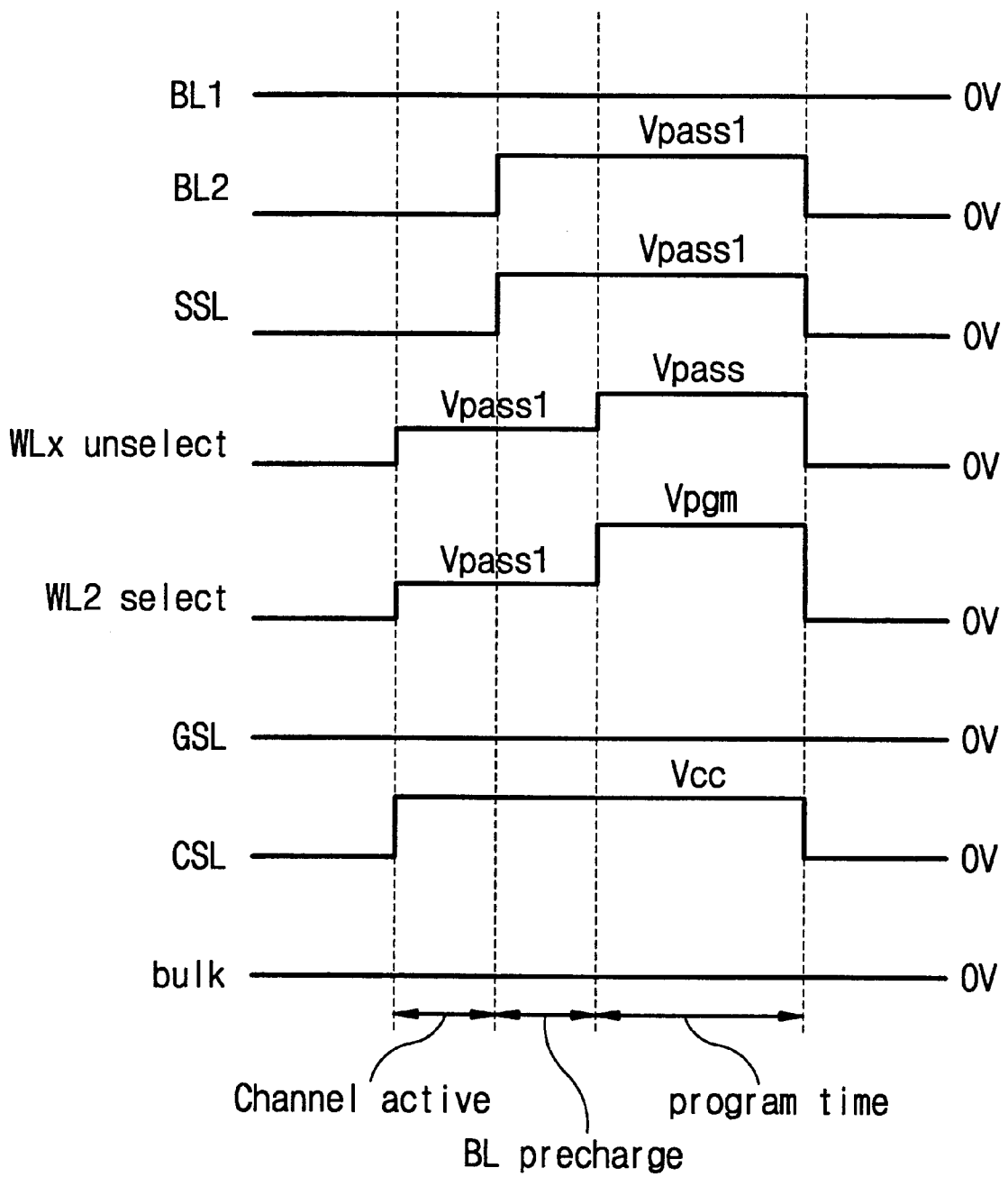
FIG. 8 is a timing view of a program operation according to a fourth embodiment of the present invention.

Referring to FIG. 8 for explaining a fourth embodiment of the present invention, a voltage of a common source line CSL is raised to Vcc. This is aimed at preventing a punch-through from lowering level of a channel voltage, if a ground select line GSL is set to 0V like the foregoing preferred embodiments. The common source line CSL is charged with Vcc to suppress generation of the punch-through caused by a boosted channel voltage.

Figure 9:
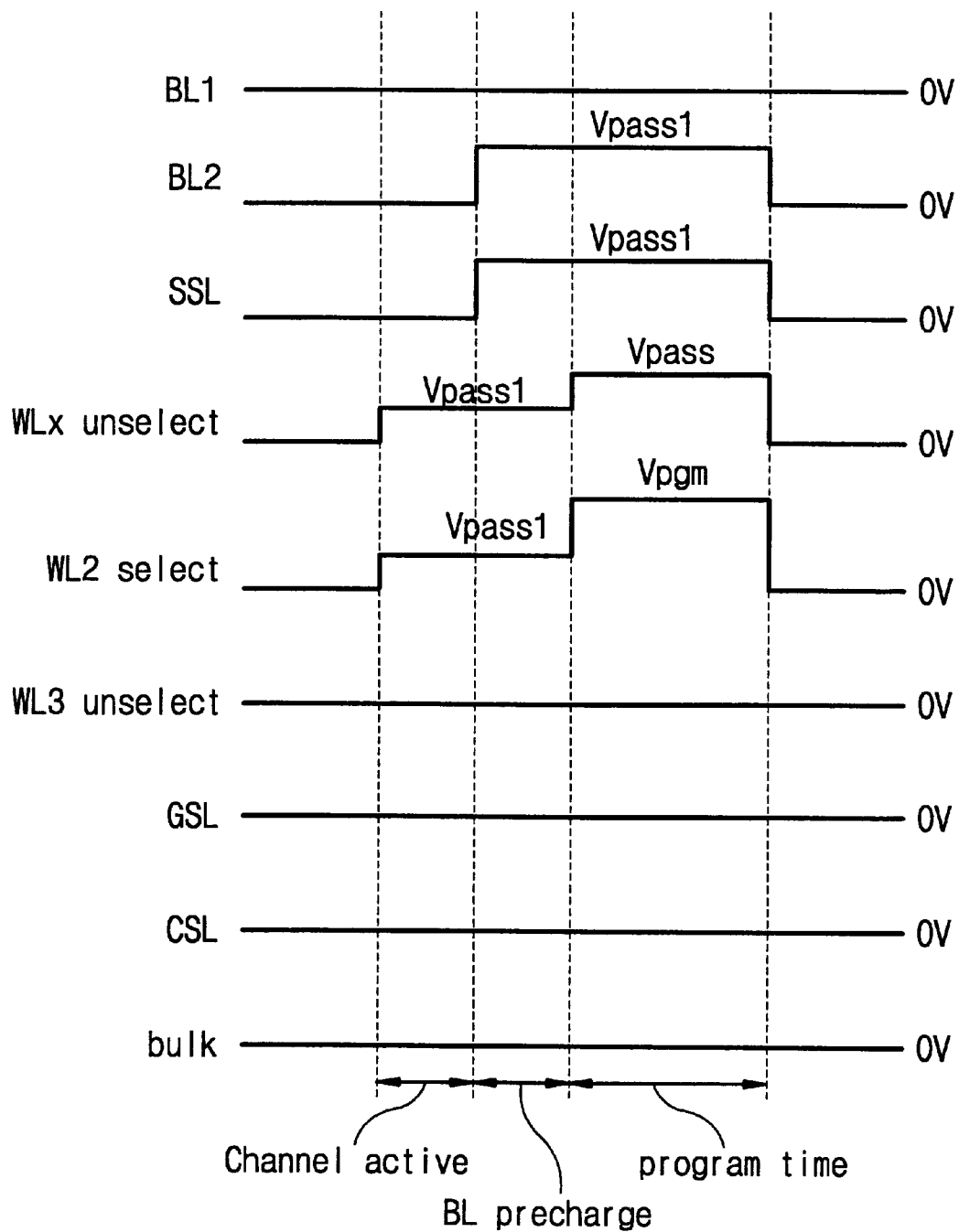
FIG. 9 is a timing view of a program operation according to a fifth embodiment of the present invention.
Figure 10:
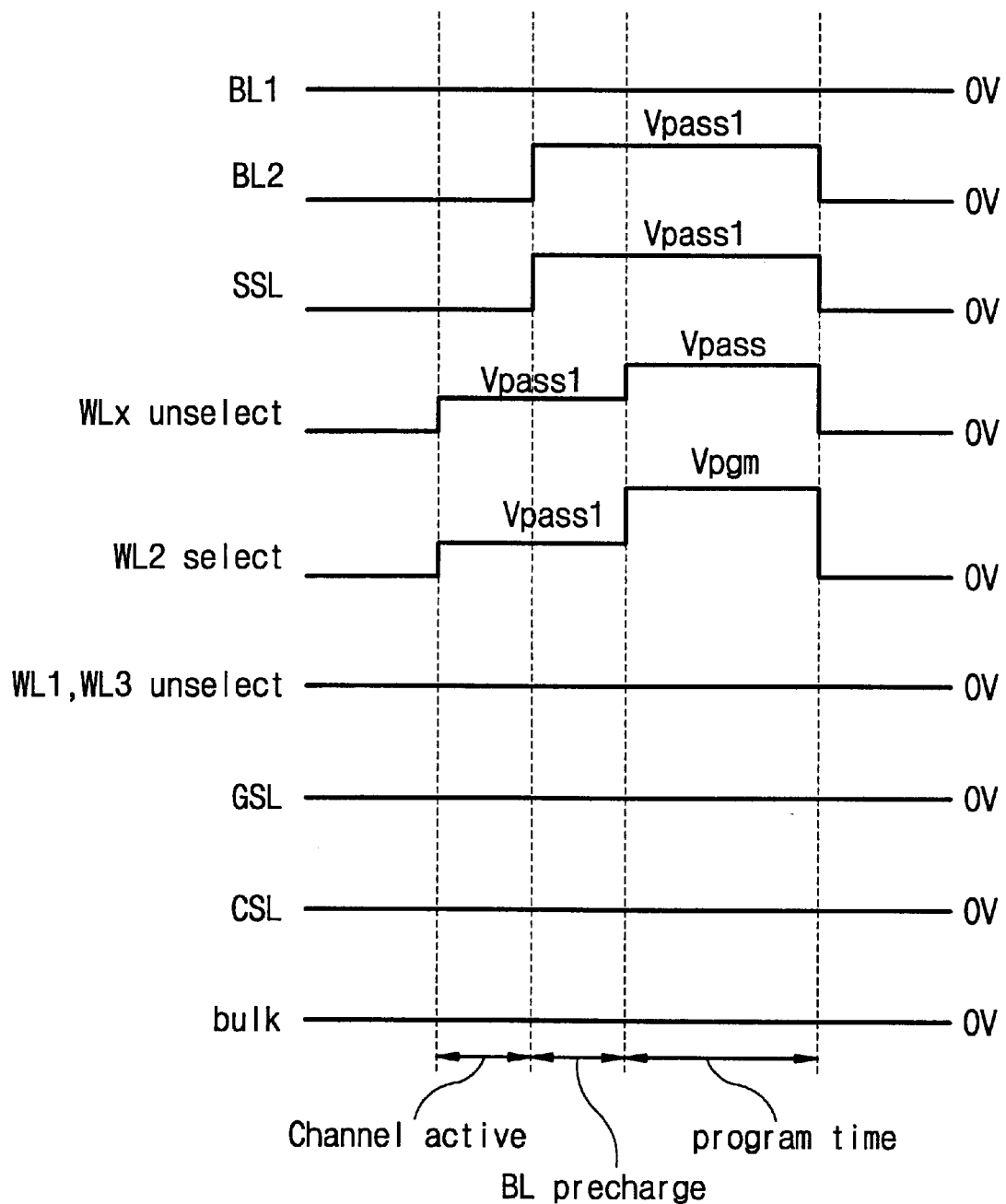
FIG. 10 is a timing view of a program operation according to a sixth embodiment of the present invention.

Referring to FIG. 9 and FIG. 10, embodiments of the present invention are illustrated when programming is performed by employing a local boosting manner for preventing a programming disturbance phenomenon. FIG. 9 illustrates one example of applying a modified local boosting manner to the programming operation shown in FIG. 5. The modified local boosting manner is to apply 0V to an unselected wordline WL3 located under a selected wordline WL2. Accordingly, a voltage formed in a channel is lowered to decrease in number of memory cells sharing a channel voltage boosted by Vpgm, and to boost a channel voltage of page program inhibit cells.

FIG. 10 illustrates an example of a conventional local boosting manner to a program operation shown in FIG. 5. The conventional local boosting manner is to apply 0V to unselected wordlines WL1 and WL3 located over and under a selected wordline WL2. Accordingly, a channel region boosted by Vpgm is limited to memory cells coupled to the selected wordline, which prevents programming disturbance phenomenon caused by a high channel voltage. Unfortunately, these local boosting manners cannot overcome a threshold voltage difference between program inhibit cells based upon a program state or an erase state. In this regard, a voltage is applied to a wordline before setting a bitline voltage to form a constant channel voltage. Therefore, a constant characteristic is present irrespectively of the fact that the unselected memory cell is placed in a program state or an erase state.

Figure 3B:
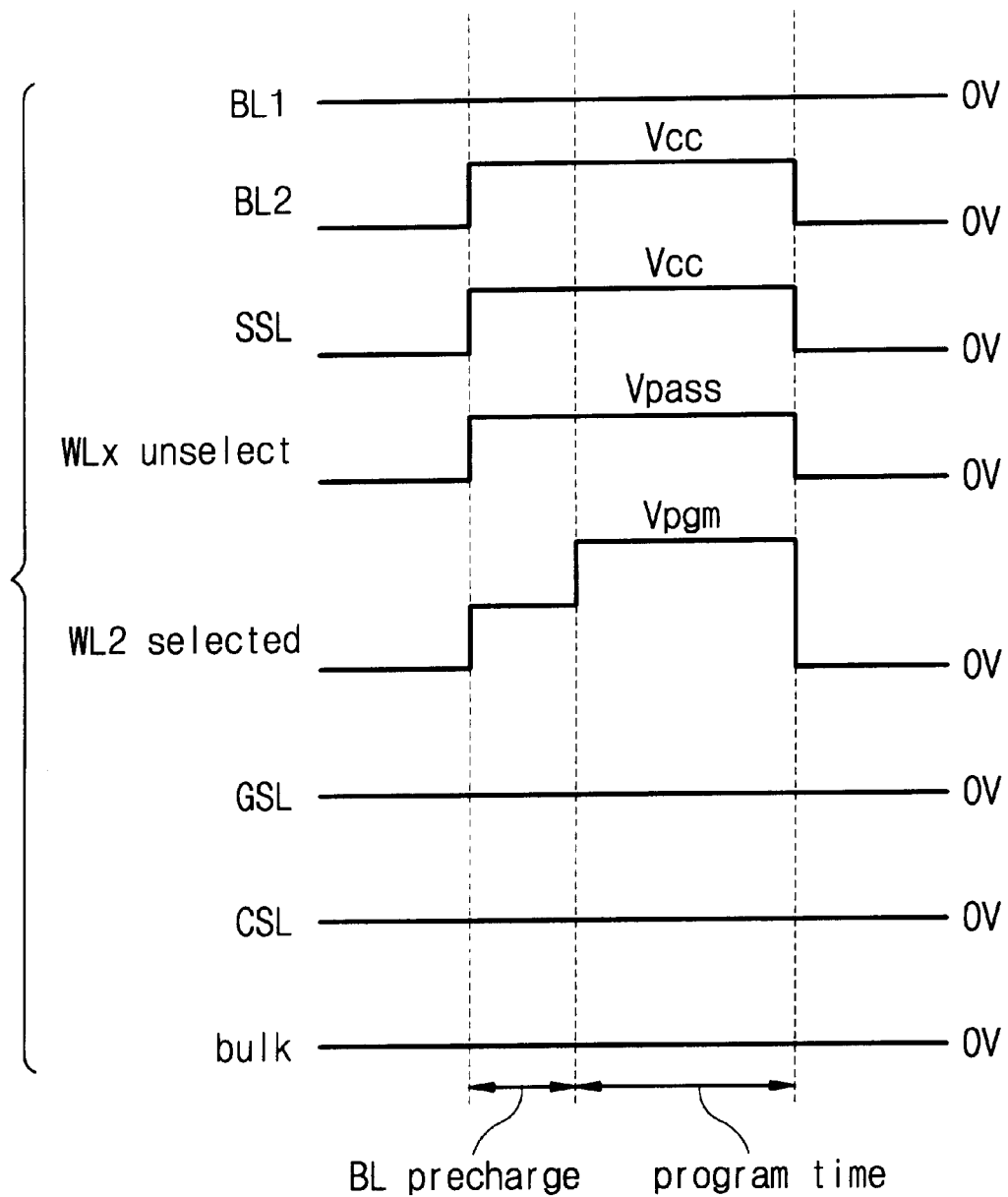
FIG. 3B is a timing view showing a conventional program operation of the device of FIG. 1.
Figure 3C:
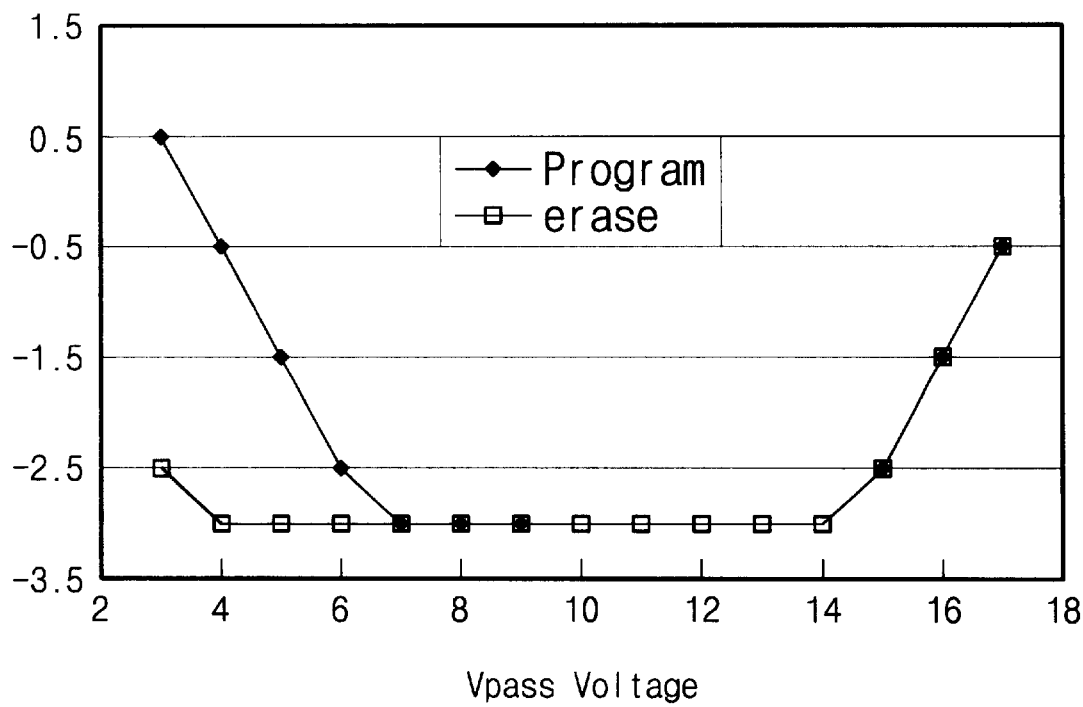
FIG. 3C is a program disturbance characteristic graph in a conventional program operation.
Figure 11:
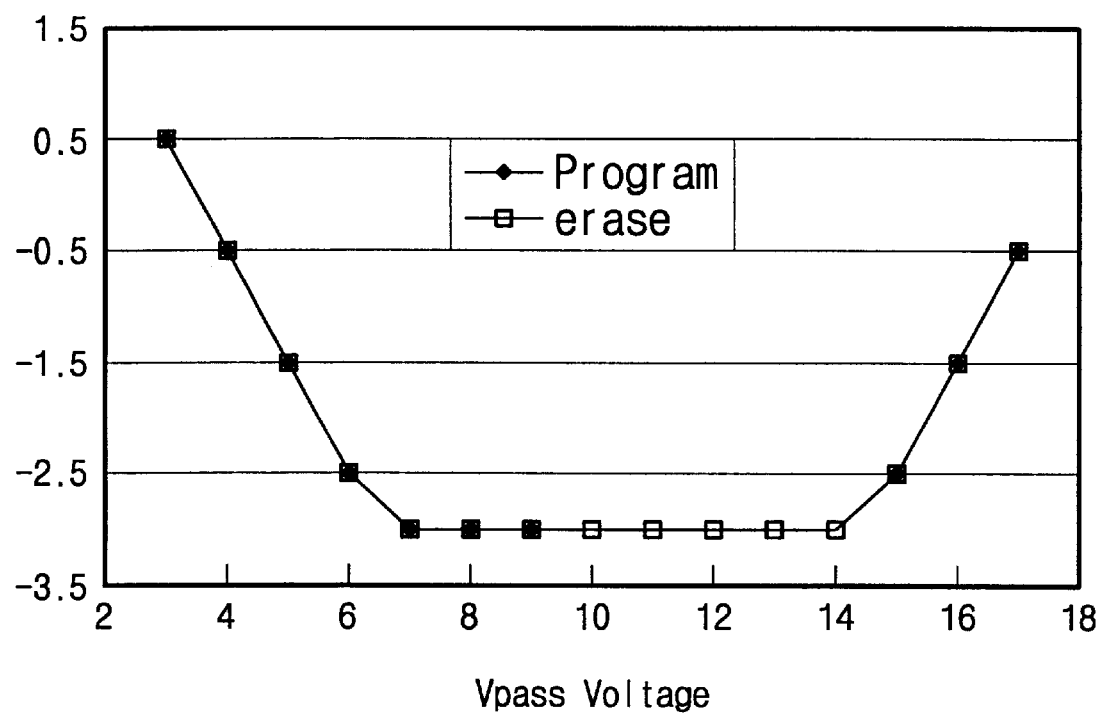
FIG. 11 is a graph showing a programming disturbance characteristic according to the present invention.

FIG. 11 is a graph showing a programming disturbance characteristic according to the invention. The effect of the invention will be better understood by contrasting the graph of FIG. 11 with that of FIG. 3C.

It will be appreciated that, according to the present invention, the same program disturb curves are obtained unselected memory cells. That is regardless of whether the unselected memory cell has an erased state or a programmed state.

While an illustrative embodiment of the present invention has been shown and described, numerous variations and alternate embodiments will occur to those skilled in the art, without departing from the spirit and scope of the invention. Accordingly, it is intended that the present invention not be limited solely to the specifically described illustrative embodiment. Various modifications are contemplated and can be made without departing from the spirit and scope of the invention as defined by the appended claims.

What is claimed is:

1. In a NAND-type flash memory device having bitlines, wordlines, and memory strings, each string composed of memory cells serially connected between a string select transistor coupled to one of the bitlines and a ground select transistor coupled to a source line, in which the wordlines are each connected to gates of the memory cells, a method of programming one of the memory cells that is defined by a selected one of the wordlines and a selected one of the bitlines, the method comprising:
applying a first voltage to a first group of wordlines that includes at least one of the wordlines other than the selected wordline;
then applying a predetermined bitline voltage to at least one of the bitlines other than the selected one of the bitlines; and
then applying a second voltage different from the first voltage to a second group of wordlines that includes at least one of the wordlines other than the selected wordline; and
applying a third voltage different from the first voltage and different from the second voltage to the selected wordline concurrently with applying the second voltage to the second group of wordlines.

2. The method of claim 1, in which the first voltage is higher than the predetermined bitline voltage and lower than the second voltage.

3. The method of claim 2, in which the predetermined bitline voltage is a power supply voltage of the NAND-type flash memory device.

4. The method of claim 1, in which the first group of wordlines includes the same wordlines as the second group of wordlines.

5. The method of claim 1, further comprising:
applying the predetermined bitline voltage also to gates of the string select transistors, while applying it to the bitline.

6. The method of claim 5, further comprising:
applying the predetermined bitline voltage to the gates of the string select transistors even before applying it to the bitline.

7. The method of claim 1, further comprising:
prior to applying the second voltage to the second group, applying the first voltage to the selected wordline concurrently with applying the first voltage to the first group of wordlines.

8. The method of claim 1, further comprising:
applying a predetermined positive voltage to the source line.

9. The method of claim 8, in which the predetermined positive voltage is a power supply voltage level.

10. The method of claim 8, further comprising:
applying a ground voltage to gates of the ground select transistors.

11. The method of claim 1, further comprising:
applying a ground voltage to one of the wordlines that is located between the selected wordline and the source line.

12. The method of claim 11, further comprising:
applying a ground voltage to another one of the wordlines that is located between the selected wordline and the string select transistor.

13. The method of claim 1, in which
the bitline voltage is between 2V and 5V,
the first voltage is between 3V and 6V,
the second voltage is between 8V and 12V, and
the third voltage is between 15V and 20V.

* * * * *